(12) United States Patent
Barnett et al.

(10) Patent No.: US 6,317,011 B1
(45) Date of Patent: Nov. 13, 2001

(54) RESONANT CAPACITIVE COUPLER

(75) Inventors: Ron Barnett, Santa Rosa, CA (US);
Charles Joseph Buondelmonte, Yardley, PA (US); Ilya Alexander Korisch, Somerset, NJ (US); Louis Thomas Manzione, Summit, NJ (US); Richard F Schwartz, Cranbury, NJ (US); Hui Wu, Union, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/521,724

(22) Filed: Mar. 9, 2000

(51) Int. Cl.⁷ ........................................................ H01P 5/08
(52) U.S. Cl. .......................................... 333/24 C; 333/260
(58) Field of Search ................................... 343/700, 770; 333/260, 24 C

(56) References Cited

U.S. PATENT DOCUMENTS

| | | | |
|---|---|---|---|
| 5,689,216 | * 11/1997 | Sturdivant | 333/33 |
| 5,861,754 | * 1/1999 | Ueno et al. | 324/660 |
| 5,936,841 | 8/1999 | Kantner et al. | 361/737 |
| 5,958,030 | 9/1999 | Kwa | 710/101 |
| 6,184,833 | * 2/2001 | Tran | 343/700 MS |

\* cited by examiner

Primary Examiner—Justin P. Bettendorf
Assistant Examiner—Dean Takaoka
(74) Attorney, Agent, or Firm—David Volejnicek

(57) ABSTRACT

A resonant capacitive coupler (124) couples signals across a gap (126) between signal transmission lines (112, 118) of two printed wiring boards (100, 102). The coupler has a conductive contact member (202 or 302) that is either positioned in close proximity to one of the transmission lines (112) or is connected to the one transmission line via a dielectric (204 or 304), and forms a capacitor therewith. The coupler further has a conductive interconnect member (200 or 300) that is connected to the contact member, and also to the other transmission line (108) either directly (FIG. 3) or via a second conductive contact member (202) (FIG. 2). The conductive interconnect member is dimensioned to have an inductive impedance at the frequency of the signals that equals, and hence cancels out, the capacitive impedance of the one or two capacitors formed by the one or two contact members. The coupler therefore resonates at the signal frequency, and relative to conventional capacitive coupling achieves a low-loss interconnection over large gaps while requiring only small capacitance to do so.

10 Claims, 3 Drawing Sheets

RESONANT CAPACITIVE COUPLER

TECHNICAL FIELD

This invention relates generally to circuit interconnection arrangements, and relates specifically to capacitive couplers.

BACKGROUND OF THE INVENTION

The recent proliferation of, and resulting stiff competition among, wireless communications products have led to price/performance demands that are difficult to meet with conventional technologies. The demands placed on radio-frequency interconnections between printed wiring boards (PWBs), and between printed wiring boards and other devices, such as antennas and filters, are no exception. Such interconnections are usually made via coaxial connectors and cables. These interconnections are expensive in terms of both the cost of the parts and the costs of manufacturing and assembly.

An alternative way of making interconnections is via capacitive coupling. A capacitive coupler is formed by two metallic parts that are a part of, or are directly connected to, the transmission lines of the components that are to be coupled, and that are positioned in close proximity to each other. One typical configuration takes the form of gap-coupled microstrip lines, where two parallel conductors, formed on the same layer of a PWB, almost but not quite abut each other or extend for a distance past each other in close proximity, whereby the adjacent edges (ends or sides) of the two conductors form a capacitor. Another typical configuration takes the form of broadside-coupled microstrip lines, where two parallel conductors, formed on adjacent layers of a PWB, extend for a distance over each other, whereby the adjacent faces of the two conductors form a capacitor. The capacitance, and consequently the size of the parts forming the capacitor, must be large enough to provide a low-impedance connection. To increase the capacitance, the adjacent edges or faces of the two conductors may be made wider than the remainder of the two conductors. However, even at wireless radio-frequencies (e.g., 0.8–3.5 GHz), the required size of the parts that form the capacitor is prohibitively large for many applications. Moreover, the parts must be positioned very close together, and therefore cannot bridge a considerable distance, e.g., the distance between PWBs.

SUMMARY OF THE INVENTION

This invention is directed to solving these problems and disadvantages of the prior art. According to the invention, a resonant capacitive coupler is used for coupling signals having a certain frequency between conductors of two physically separate components, such as substrates (e.g., printed wiring boards), that are separated by an air gap. According to a first embodiment of the invention, the coupler has a first conductive element adapted for placement in proximity to a conductor of a first one of the substrates to form therewith a capacitor having a capacitive impedance at the signal frequency, and a second conductive element connected to the first element and adapted for spanning the air gap and connecting to a conductor of a second one of the substrates. The second element has an inductive impedance that substantially equals the capacitive impedance at the signal frequency, whereby the impedances substantially cancel each other out and the coupler resonates at the signal frequency. According to a second embodiment of the invention, the coupler has a pair of first conductive elements each adapted for placement in proximity to a conductor of a different one of the substrates to form a capacitor therewith, and a second conductive element adapted for spanning the air gap and connected to the pair of first conductive elements. The capacitors have a combined capacitive impedance and the second element has an inductive impedance that substantially equals the combined capacitive impedance at the signal frequency, whereby the impedances substantially cancel each other out and the coupler resonates at the signal frequency.

According to another aspect of the invention, an electronic device that comprises a first substrate carrying a first conductor of signals and a second substrate physically separated from the first substrate by an air gap and carrying a second conductor of the signals further comprises the resonant capacitive coupler which spans the air gap and couples the signals between the first and the second conductors.

The resonant capacitive coupler provides a simple, inexpensive, low-loss interconnection between conductors on separate substrates. The design of the coupler presents a very-low series impedance to the signals and thereby allows it to bridge wide gaps between substrates while using a much smaller capacitance than would otherwise be needed if conventional capacitive coupling was employed. The coupler further lends itself to use with "drop-in" system components that require minimum assembly, such as a structure where one or both of the "substrates" are sheet metal parts and the coupler is formed as a tab integral with one of these parts.

These and other advantages and features of the invention will become more evident from the following description of illustrative embodiments of the invention considered together with the drawing.

DETAILED DESCRIPTION

Figure 1:
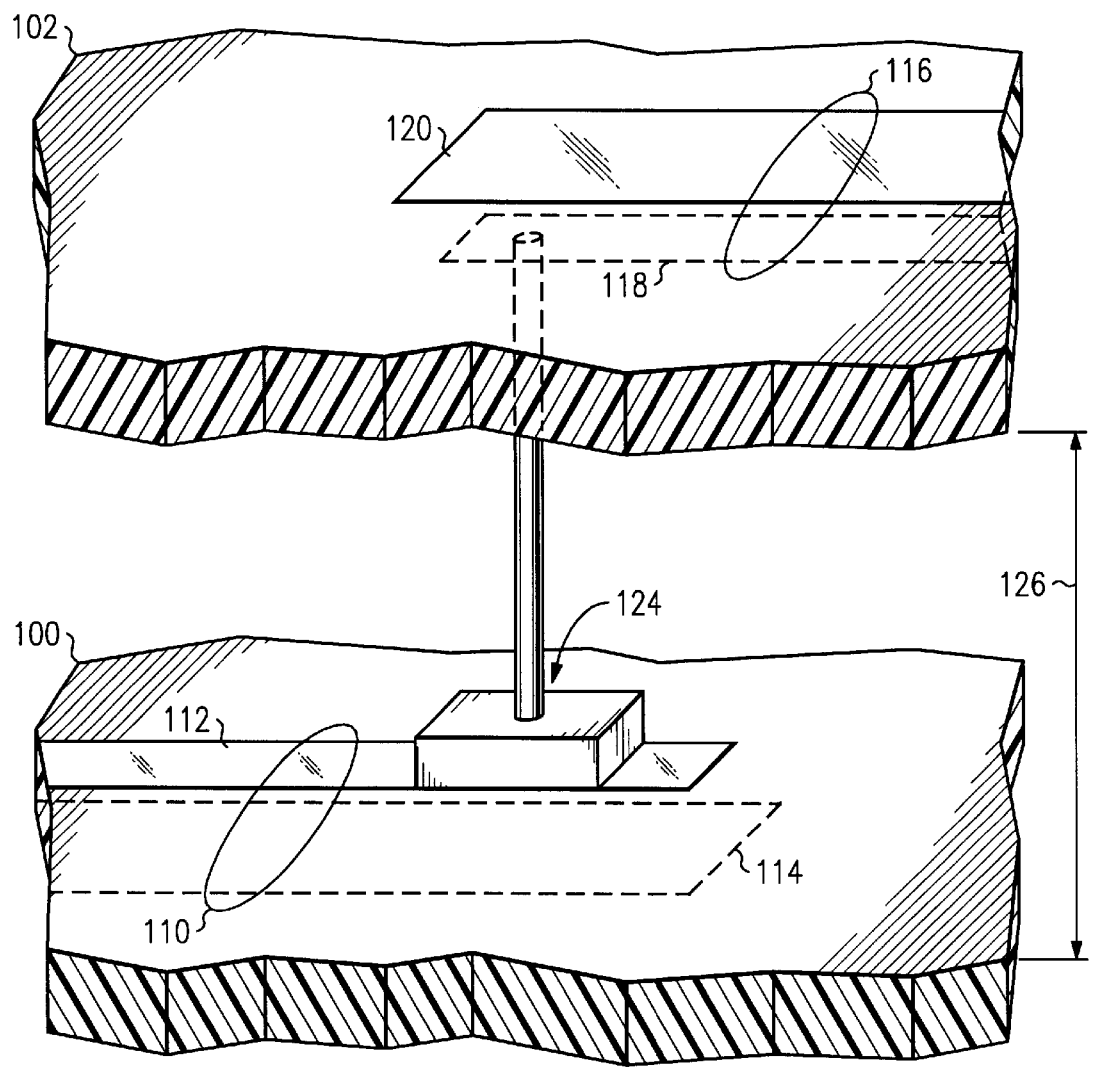
FIG. 1 shows a perspective view of a pair of devices interconnected according to an illustrative embodiment of the invention.

FIG. 1 shows portions of a pair of PWBs 100 and 102 or some other devices (e.g., metal laminate antennas or filters) that are interconnected by a resonant capacitive coupler 124. PWBs 100 and 102 are positioned substantially parallel and adjacent to each other, e.g., they are "stacked". Each PWB 100, 102 defines a microstrip line 110, 116, respectively. Each microstrip line comprises a printed conductor of signals on one face of a PWB layer and a printed shield (e.g., a ground plane) on the other face of that PWB layer: microstrip line 110 comprises conductor 112 and shield 114, and microstrip line 116 comprises conductor 118 and shield 120. While microstrip lines 110, 116 are preferred, other transmission line arrangements may be used as well.

Preferably, conductors 112 and 118 face each other across a gap 126 between PWBs 100 and 102. Conductors 112 and 118 are interconnected by resonant capacitive coupler 124 which spans gap 126.

Coupler 124 can bridge fairly wide gaps 126, by means of a structure that forms a series inductive-capacitive circuit (or a more-complex but still series resonance-type circuit) that resonates at the operating frequency f of the circuit that includes conductors 112 and 118 and provides substantially lossless interconnection near the resonant frequency. The capacitor of the inductive-capacitive circuit provides not just coupling, but in fact compensates for the inductance of the interconnecting member (which is relatively long). The capacitor in this design may be much smaller (in some cases by an order of magnitude) than a coupling capacitor that would be used conventionally to connect two 50 Ω sections, and hence is easier to implement. This type of connection can be applied to coaxial, two-wire, and coplanar waveguide types of interconnecting structures. The capacitor itself may or may not have a dielectric other than air. The dielectric may be anything from a ceramic to double-sided adhesive tape, which provides mechanical robustness.

Figure 2:
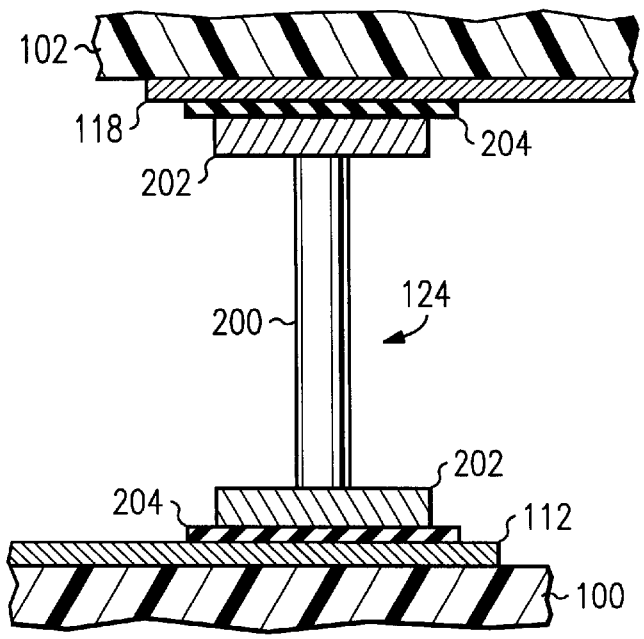
FIG. 2 shows a front view of a first illustrative embodiment of a resonant capacitive coupler of the devices of FIG. 1.

FIGS. 2–5 show four illustrative embodiments of resonant capacitive coupler 124. FIG. 2 shows an embodiment that provides capacitive coupling to both conductors 112 and 118. Coupler 124 has an "I", or a barbell, shape comprising two elongated conductive contact members 202 positioned in parallel to conductors 112, 118 and to each other and connected by a conductive interconnect member 200 that is positioned substantially perpendicularly to contact members 202. Each contact member 202 is preferably shaped substantially like a segment of conductor 112 or 118: it is flat and preferably has the same width as conductor 112 or 118, while its length is determined by the required capacitance. Each contact member 202 is positioned adjacent to one of the conductors 112 and 118, and is physically mounted thereto but separated therefrom by a dielectric layer 204. This type of connection advantageously serves the purpose of providing mechanical support and thermal conductivity in addition to an RF connection. Each contact member 202 and its adjacent conductor 112 or 118 forms a capacitor whose capacitance C is determined by the thickness d and permittivity $\epsilon$ of dielectric layer 204 and the area A of contact member 202 that faces its adjacent conductor 112 or 118, as is well known in the art and expressed by the formula (neglecting fringe capacitances)

$$C = \epsilon_o \epsilon \frac{A}{d} \quad \text{Where } \epsilon_o = 8.854 \cdot 10^{-12} \tfrac{\text{Farads}}{\text{meter}}$$

The capacitive impedance $Z_c$ of each capacitor is determined by the capacitance C and the operating frequency f (the frequency of the signals that are conveyed by conductors 112 and 118), as is well known in the art and expressed by the formula $$Z_c = \frac{1}{2\pi f C}$$

In order to minimize the capacitance required for effective coupling of conductors 112 and 118, the capacitive impedance must be minimized. This can be achieved by providing an equal inductive capacitance in series with the capacitive impedance. The two impedances cancel each other out and create a resonant circuit. As is well known in the art, the inductive impedance $Z_L$ is expressed by the formula $$Z_L = 2\pi f L$$

where L is the inductance of the circuit. According to the invention, the inductance is provided by interconnect member 200. The inductance of member 200 is determined by numerical analysis from the length and cross-sectional area of member 200, as is known in the art and described in, for example, Goldfarb and Pucel, "Modeling Via Hole Grounds in Microstrip", *IEEE Microwave and Guided Wave Letters*, Vol. 1, No. 6, (June 1991), pp. 135–137.

Thus, with the proper choice of dimensions for member 200, coupler 124 resonates at the operating frequency f and provides substantially zero-impedance capacitive coupling between conductors 112 and 118.

Figure 3:
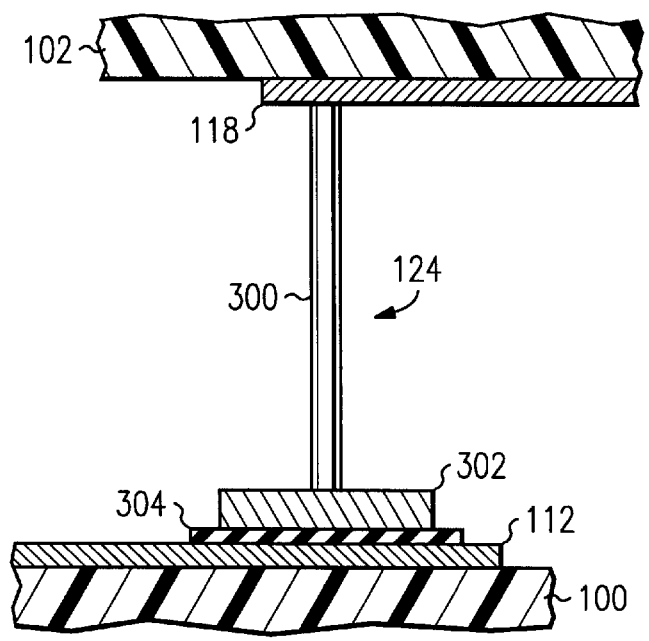
FIG. 3 shows a front view of a second illustrative embodiment of the resonant capacitive coupler of the devices of FIG. 1

FIG. 3 shows an embodiment of resonant capacitive coupler 124 that provides capacitive coupling to one of the conductors 112 and 118 and conductive coupling to the other of the conductors 112 and 118. Coupler 124 has a "T" shape comprising an elongated conductive contact member 302 positioned parallel to conductor 112 and connected to conductor 118 by a conductive interconnect member 300 that is positioned substantially perpendicularly to contact member 302 and conductor 118. Contact member 302 is preferably shaped like contact members 202 of FIG. 2. Contact member 302 is positioned adjacent to conductor 112 and is separated therefrom by a dielectric layer 304. Contact member 302 may be physically mounted to conductor 112 by dielectric layer 304. Alternatively, dielectric layer 304 may be an airgap. Interconnect member 300 is physically connected to conductor 112, illustratively by being soldered or epoxied thereto. Alternatively, interconnect member 300 may be an extension of conductor 118 that has been bent to form a tab 300. Contact member 302 and conductor 112 form a capacitor whose capacitance C is determined in the manner described for FIG. 2. Its capacitive impedance is likewise determined in the manner described for FIG. 2. The length and cross-sectional area of interconnect member 300 are chosen to produce an inductance L such that coupler 124 resonates at the operating frequency f according to the formula $$f_{res} = \frac{1}{2\pi\sqrt{LC}}$$

Figure 4:
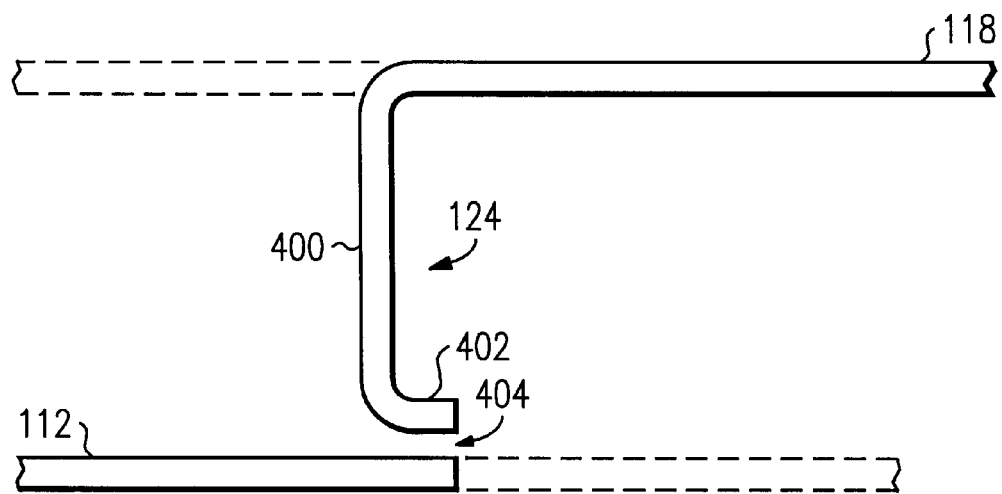
FIG. 4 shows a front view of a third illustrative embodiment of the resonant capacitive coupler of the devices of FIG. 1.
Figure 5:
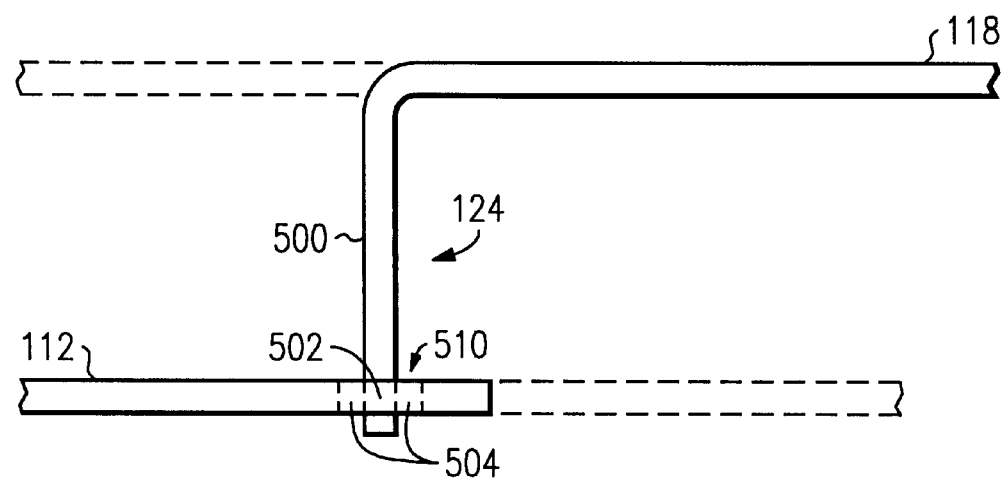
FIG. 5 shows a front view of a fourth illustrative embodiment of the resonant capacitive coupler of the devices of FIG. 1.

FIGS. 4 and 5 show embodiments of coupler 124 that are particularly suited for use with "drop-in" system components that require minimum assembly. An illustrative example of such a system is described in the application of Barnett et al. entitled "Electronic Stacked Assembly", U.S. application Ser. No. 09/521,935, filed on even date herewith and assigned to the same assignee. These embodiments are a variation on the embodiment of FIG. 3. In these embodiments, an extension of conductor 118 forms a tab that defines both an interconnect member 400 or 500 and a contact member 402 or 502. In FIG. 4, the tip of the tab defines contact member 402. The tip is bent to lie parallel to conductor 112 to form a capacitor therewith. Dielectric 404 which separates contact member 402 from conductor 112 is illustratively an air gap. In FIG. 5, the tip of the tab defines contact member 502 which extends through a hole 510 defined by conductor 112 to form a capacitor therewith. Dielectric 504 which separates contact member 502 from the walls of hole 510 is illustratively an air gap. The calculations for dimensioning coupler 124 in the embodiments of FIGS. 4 and 5 are the same as for the embodiment of FIG. 3.

Of course, various changes and modifications to the illustrative embodiments described above will be apparent to those skilled in the art. Such changes and modifications can be made without departing from the spirit and the scope of the invention and without diminishing its attendant advantages. It is therefore intended that such changes and modifications be covered by the following claims except insofar as limited by the prior art.

What is claimed is:

1. A capacitive coupler for coupling signals having a frequency f between conductors of two physically separate substrates that are separated by an air gap, comprising:

a first conductive element adapted for placement in proximity to a conductor of a first one of the substrates to form a capacitor having a capacitive impedance at the frequency f; and a second conductive element connected to the first element and adapted for spanning the air gap and connecting to a conductor of a second one of the substrates, the second element having an inductive impedance at the frequency f that equals the capacitive impedance, whereby the impedances cancel each other out and the first and the second elements form a resonant circuit that resonates at the frequency f.

2. The capacitive coupler of claim 1 wherein:

the second element is adapted for effecting electrical contact with the other conductor.

3. The capacitive coupler of claim 1 wherein:

the second element is a physical extension of the other conductor.

4. The capacitive coupler of claim 1 wherein:

the second element is defined by a flange of the other conductor.

5. The capacitive coupler of claim 1 further comprising:

a dielectric material connected to the first element and adapted to contact the one conductor to form a part of the capacitor.

6. A capacitive coupler for coupling signals having a frequency f between conductors of two physically separate substrates that are separated by an air gap, comprising:

a pair of first conductive elements each adapted for placement in proximity to a conductor of a different one of the substrates to form a capacitor, the capacitors having a combined capacitive impedance at the frequency f; and a second conductive element adapted for spanning the air gap and connected to the pair of first conductive elements, the second element having an inductive impedance at the frequency f that is equal to the combined capacitive impedance, whereby the impedances cancel each other out and the first and the second elements form a resonant circuit that resonates at the frequency f.

7. The capacitive coupler of claim 6 further comprising:

dielectric material connected to each of the first elements and adapted to contact the two conductors to form a part of the capacitors.

8. An electronic device comprising:

a first substrate carrying a first conductor of signals having a frequency f;

a second substrate physically separated from the first substrate by an air gap and carrying a second conductor of the signals; and a capacitive coupler spanning the air gap and coupling the signals between the first and the second conductors, the coupler having a capacitive impedance and a substantially equal inductive impedance at the frequency f, whereby the impedances cancel each other out and the coupler resonates at the frequency f.

9. The device of claim 8 wherein:

the capacitive coupler comprises a first conductive element positioned in proximity to the first conductor and forming therewith a capacitor having the capacitive impedance, and a second conductive element connected to the first element and coupled to the second conductor, the second element forming an inductor having the inductive impedance.

10. The device of claim 8 wherein:

the capacitive coupler comprises a pair of first conductive elements each positioned in proximity to a different one of the conductors and forming therewith a pair of capacitors jointly having the capacitive impedance, and a second conductive element connected to the pair of first conductive elements and forming an inductor having the inductive impedance.

* * * * *